US008095898B1

(12) United States Patent
Wu et al.

(10) Patent No.: US 8,095,898 B1
(45) Date of Patent: Jan. 10, 2012

(54) METHOD AND SYSTEM FOR IMPLEMENTING ELECTRONIC DESIGN ENTRY

(75) Inventors: Ping-Chih Wu, Cupertino, CA (US); Lung-Chun Liu, Saratoga, CA (US); Wei-Jin Dai, Los Altos Hills, CA (US); Thad Clay McCracken, Portland, OR (US)

(73) Assignee: Cadence Design Systems, Inc., San Jose, CA (US)

( * ) Notice: Subject to any disclaimer, the term of this patent is extended or adjusted under 35 U.S.C. 154(b) by 444 days.

(21) Appl. No.: 11/965,716

(22) Filed: Dec. 27, 2007

Related U.S. Application Data (60) Provisional application No. 60/951,098, filed on Jul. 20, 2007.

(51) Int. Cl.
 *G06F 17/50* (2006.01)
(52) U.S. Cl. ........ 716/102; 716/126; 716/129; 716/130; 716/139
(58) Field of Classification Search ............ 716/1, 8–14, 716/100, 102, 126, 129, 130, 139; 715/272
See application file for complete search history.

(56) References Cited

U.S. PATENT DOCUMENTS

| | | | | |
|---|---|---|---|---|
| 6,966,039 | B1 * | 11/2005 | Bartz et al. | 716/1 |
| 7,165,214 | B2 * | 1/2007 | Ishizaka | 715/213 |
| 7,168,041 | B1 * | 1/2007 | Durrill et al. | 715/700 |
| 7,770,113 | B1 * | 8/2010 | Anderson et al. | 715/272 |

OTHER PUBLICATIONS

Binkley, D.M., Tradeoffs and Optimization in Analog CMOS Design, International Conference on Mixed Design of Integrated Circuits and Systems, 2007. MIXDES '07. Jun. 14, 2007, pp. 47-60.

Ng, A. et al., Toward quality EDA tools and tool flows through high-performance computing, Sixth International Symposium on Quality of Electronic Design, 2005. ISQED 2005, Mar. 2005, pp. 22-27.

Brandtner, T., Chip-package codesign flow for mixed-signal SiP designs, IEEE Design & Test of Computers, May-Jun. 2006, vol. 23, Issue 3, pp. 196-202.

Trlica, C., Software applications, IEEE Spectrum, Jan. 1996, vol. 33, Issue 1, pp. 56-59.

Li, W. et al., Certify—A characterization and validation tool for behavioral models, IEEE International Behavioral Modeling and Simulation Workshop, 2007. BMAS 2007, Sep. 2007, pp. 40-45.

Scott, T.H., The evolution of schematic entry: moving from gates to geography, WESCON/'95. Conference record. 'Microelectronics Communications Technology Producing Quality Products Mobile and Portable Power Emerging Technologies', Nov. 1995, pp. 288-291.

Bonfield, T. et al., A multiple-perspective design advisory system for use in the layout design of printed circuit board assemblies, IEEE Transactions on Electronics Packaging Manufacturing, Apr. 2003, vol. 26, Issue 2, pp. 115-122.

Lee, J., Back to the language roots, http://kom.aau.dk/~oo/semesters/aspi/litterature/language%20roots.pdf, Dec. 2004.

Indrusiak, L., A Review on the Framework Technology Supporting Collaborative Design of Integrated Systems, Jun. 2002, pp. 1-109.

Goering, R. et al., Yields, packages hang up design below 100 nm, EE Times, Mar. 2003.

* cited by examiner

*Primary Examiner* — Vuthe Siek
(74) *Attorney, Agent, or Firm* — Vista IP Law Group, LLP (57) ABSTRACT

Disclosed are improved approaches for implementing design entry. An efficient, spread-sheet based representation is provided for both the instances and connections in a design. Visualization techniques provide the user with visual cues, to direct and identify compatible connection points, unconnected instances, and contention situations. Techniques are disclosed to automatically filter the spreadsheet in a variety of ways, to help the user to dynamically hide portions of the design space that are not interesting at a particular time, and thus to improve the efficiency with which they can work.

26 Claims, 8 Drawing Sheets

METHOD AND SYSTEM FOR IMPLEMENTING ELECTRONIC DESIGN ENTRY

CROSS-REFERENCE TO RELATED APPLICATIONS

This application claims the benefit of U.S. Provisional Application No. 60/951,098 filed on Jul. 20, 2007, which is hereby incorporated by reference in its entirety.

FIELD OF THE INVENTION

The invention relates to the field of electronic design, and in particular, relates to an improved approach for electronic design entry and modification.

BACKGROUND

The task of performing modern design-entry/description for an electronic design often includes execution of the following tasks: (a) instantiation of components into the design; and (b) inter-connection of instance terminals (usually referred to as pins or ports). For the purpose of discussion, an "instance" is a specific instantiation of a component, or cell. Cells can be hierarchical (and thus themselves contain instantiations of other cells), or flat (i.e. physical).

Modern designs are very complex, in that they contain many hundreds of thousands to potentially millions of physical instances, and potentially hundreds/thousands of hierarchical instances. Architecture-level connectivity specification, which generally specifies the interconnection between hierarchical instances, may be performed using one of the following two approaches: (1) using a text editor to handwrite HDL or (2) using a schematic-entry tool to visually create and specify connections.

The problem with these possible approaches is that as the modern design space becomes larger and larger and ever more complex, it becomes very difficult for a typical user to efficiently see the design-space in which they are working with either of these methods. This causes the user to have difficulty navigating the design space to, for instance, find the ports on hierarchical instances that should be connected together.

Another drawback with using a text-editor HDL-based design entry is that it is difficult to quickly search for a port of a certain type or name on a specific instance. This causes the user to have to largely manually search for such a port, using primitive text-editor-based search techniques.

One other problem is that text-editor HDL based approaches allow for a multitude of mistakes to be made by the user, including contention creation, connection of incompatible instance-ports (e.g., functional or electrical incompatibility), or simple misspellings that result in opens or failure to connect. These types of mistakes can be very costly to debug in a simulation environment, which is where they are typically found.

Schematic-entry specification of design connectivity help the user to visualize components as physical entities, but even the best schematic-drawing environments do not effectively represent complex connectivity in a way that is easy to read, to filter, or to edit. For instance, schematics at even the hierarchical/architectural level for modern, complex designs tend to look like a "rats nest" of connections, and quickly become practical unusable for real design-entry.

Typical methods to organize schematic-entry-based approaches to make them more readable essentially amount to breaking the design up across multiple schematic sheets, thus fracturing the design into so many pieces that it becomes difficult to really see the big picture, or change the fracturing to suit the current visualization needs of the user.

Therefore, there is clearly a need for implementing design entry that addresses these and other problems.

SUMMARY

Embodiments of the present invention provide an improved approach for implementing design entry. According to some embodiments, an efficient, spread-sheet based representation is provided of both the instances and connections in a design. Visualization techniques provide the user with visual cues, to direct and identify compatible connection points, unconnected instances, and contention situations. Some embodiments include techniques to automatically filter the spreadsheet in a variety of ways, to help the user to dynamically hide portions of the design space that are not interesting at a particular time, and thus to improve the efficiency with which they can work.

Further details of aspects, objects, and advantages of the invention are described below in the detailed description, drawings, and claims. Both the foregoing general description and the following detailed description are exemplary and explanatory, and are not intended to be limiting as to the scope of the invention.

DETAILED DESCRIPTION

Embodiments of the present invention provide an improved approach for implementing design entry. In some embodiments, the invention provides for an efficient, spreadsheet based representation of both the instances and connections in a design. In addition, visualization techniques provide the user with visual cues, to direct him/her to compatible connection points, unconnected instances, and/or contention situations. Some embodiments include techniques to automatically filter the spreadsheet in a variety of ways, to help the user to dynamically hide portions of the design space that are not interesting at a particular time, and thus to improve the efficiency with which they can work. Furthermore, some embodiments provide visualization techniques that allow design instances to be collapsed or minimized, while still showing the user aggregate information about that instances connectivity status. This allows for efficient navigation of the design space without the user having to look at every port on every instance.

Figure 1:
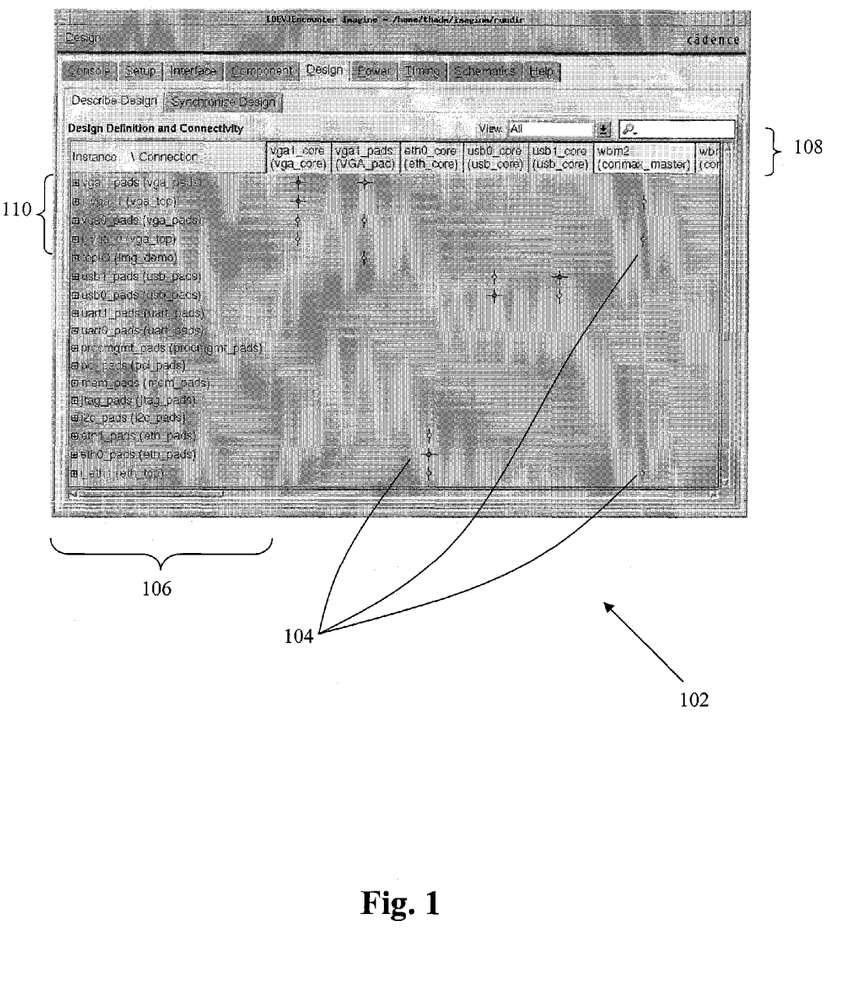
FIG. 1 illustrates a design entry interface according to some embodiments of the invention.

As illustrated in FIG. 1, some embodiments of the invention includes a graphical user interface 102 in spreadsheet format with different icons 104 in each spreadsheet cell to represent states of connections between instances. The spreadsheet has instances listed in the first column 106 and connections in the first row 108.

Instances are added to the design by adding rows to the spreadsheet, and associating a component (e.g., cell) type with the new instance. Similarly, connections are created by adding columns to the spreadsheet.

This approach leverages the concept of a functional interface, with is a grouping of functionally related signals into a single interface entity. For instance, a "PCI" interface-type would include member signals such as TRDY, IRDY, STOP, AD, PERR, and SERR. When connections are created (e.g., by adding a new column to the spreadsheet), an interface-type may be associated with the connection. In so doing, this allows for capture of the user's intent to use the new connection to connect two or more instance-interfaces of a specific interface-type.

This information is used to populate the body of the spreadsheet with visual cues 104 (e.g., icons) to indicate which instances have interfaces that are compatible with the indicated interface type. In FIG. 1, the top 4 instances 110 in the spreadsheet have interfaces that are compatible with the interface type "vga_core", since they have icons indicating this fact in the spreadsheet cell at the intersection of the instance row and connection column. Conversely, lack of an iconic indicator for other instances in the design allows one to immediately disregard those instances, and thus most of the design-space, for the purposes of defining the connection in column 1. This visual feedback is very useful in that it saves having to inspect or even remember which instances could be potentially included in any particular connection-type.

Iconic cues allow the user to focus on the instances that could be potentially included in a connection, and further expand them to show the interfaces that they contain. This allows for expansion of an instance with a single mouse-click. An example of expanded instances is shown the interface 200 of FIG. 2. In this figure, it can be seen, for example, that instance "vga1_pads" 202 contains interfaces "pad" 204 and "core" 206, while instance "i_vga__1" 208 contains interfaces "vga" 210, "wbm" 212, and "wbs" 214.

Figure 2:
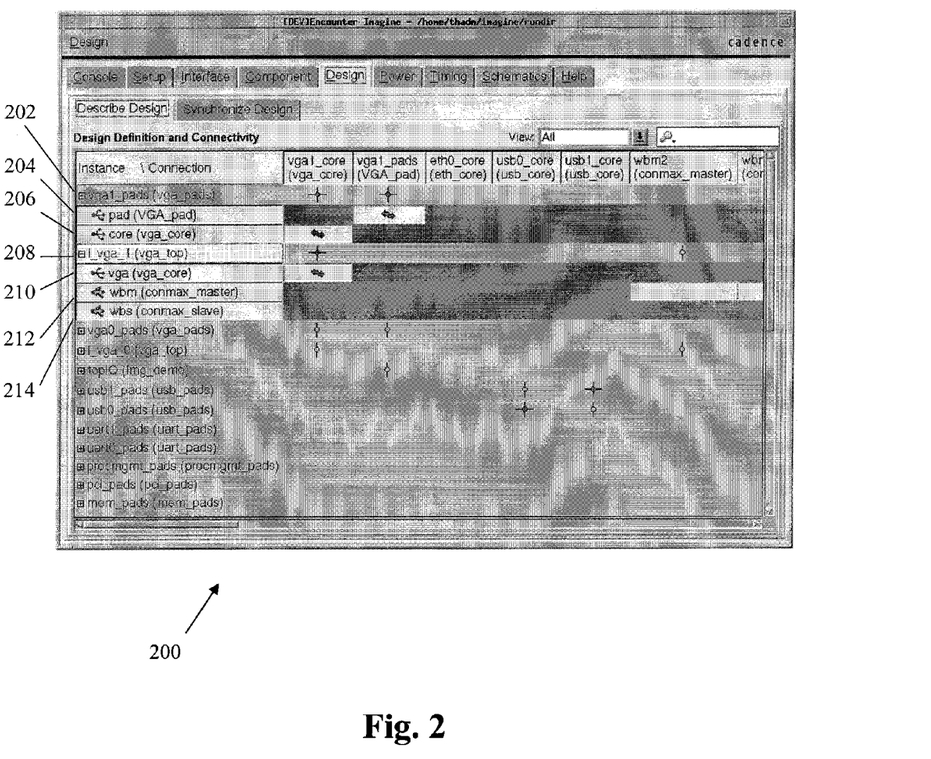
FIG. 2 illustrates expanded instances within a design entry interface according to some embodiments of the invention.

A particular instance-interface can be added (connected) or removed (disconnected) from a connection by simply clicking in the cell at the intersection of the connection (column) and instance-interface (row). The connection-status of a particular instance-interface is visually represented by the presence, or lack thereof, of a specific icon (e.g., a colored arrow such as a green arrow). Clicking in the associated cell causes this status to toggle.

In addition, the approach can be configured such that when an instance is collapsed, its status with regard to inclusion in a particular connection is represented in-aggregate by the icon in the cell at the intersection of the instance-row and connection-column. If a collapsed instance is included in a particular connection, this icon is a "plus" sign with a filled-in circle. If the instance is compatible with a connection, but not actually included in it, the icon is a single vertical line, with an empty circle. This is significant in that it allows the user to visualize connectivity even when instance-details are collapsed, or hidden.

In addition, when an instance is expanded, the interface can be configured such that only cells corresponding to compatible connection points are clickable. Cells corresponding to interfaces that are not compatible with the associated connection type are greyed-out and not clickable. This simultaneously provides the user with quick visual guidance to appropriate place in the design space, and prevents them from making an inadvertent error by connecting incompatible interfaces.

The instance-names themselves are also colorized to provide the user with quick visual feedback as to where there is unspecified connectivity. In the present example, it can be easy to see that instances for which connectivity is not fully defined, e.g. some interfaces are unconnected, are colorized, e.g., in red, and instances that are fully connected are colorized in a different color, e.g., in green. This colorization is updated dynamically as the user clicks through the spreadsheet, to constantly guide the user to portions of the design space that still need to be connected.

Embodiments can also sort the spreadsheet in many different fashions, to support dynamic isolation of various portions of the design-space, and thus improve user productivity. An example of such a sorting capability is to pull rows (instances) that are compatible with a particular interface-type to the top of the spreadsheet. Another example is to pull columns (connections) that are compatible with the interfaces on a particular instance to the left of the spreadsheet. In addition, sorting can be performed for rows based on instance-type, or columns based on connection-type. Another example sorting approach is to sort rows based on instance-name, or columns based on connection-name. Sorting can also be performed to display only instances matching a certain regular-expression pattern.

The focus in this example has been on connections associated with functional interfaces, such as groups of signals. The same concept, however, could be applied to design entry that does not rely on functional interface definitions. For example, this approach can be used to provide similar visual feedback regarding instances in a design have ports that are wide-enough to be part of a newly created and/or bussed connection or to provide visual cues to indicate (e.g., on a port or in-aggregate for an instance) where specific connectivity has created a contention situation.

Figure 3:
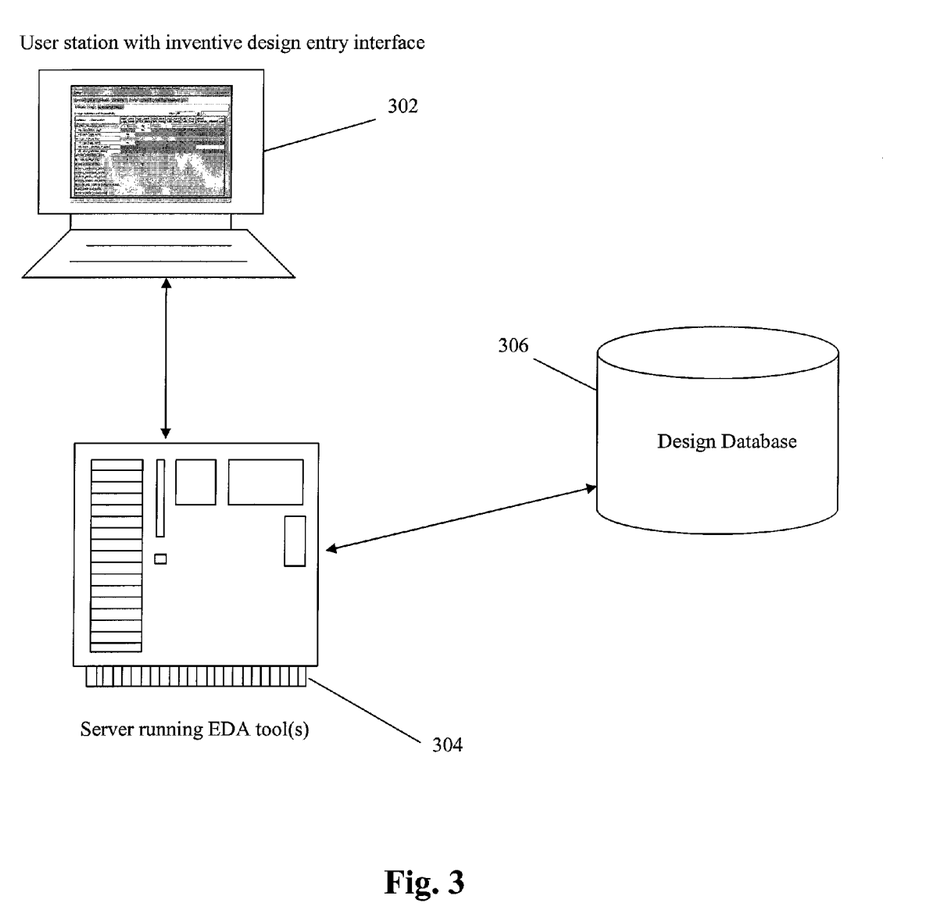
FIG. 3 shows a design entry system with which embodiments of the invention can be implemented.

FIG. 3 provides an illustration for a design entry system with which embodiments of the invention can be implemented. The system includes one or more user stations 302 that users can use to display and interact with the inventive design entry interfaces described and shown with respect to FIGS. 1 and 2. The user stations operate across a network against a server 304 that executes one or more appropriate EDA tools for performing design of electronic circuits, components, or devices. The server accesses and stores the electronic design in a database/storage system 306.

Figure 4:
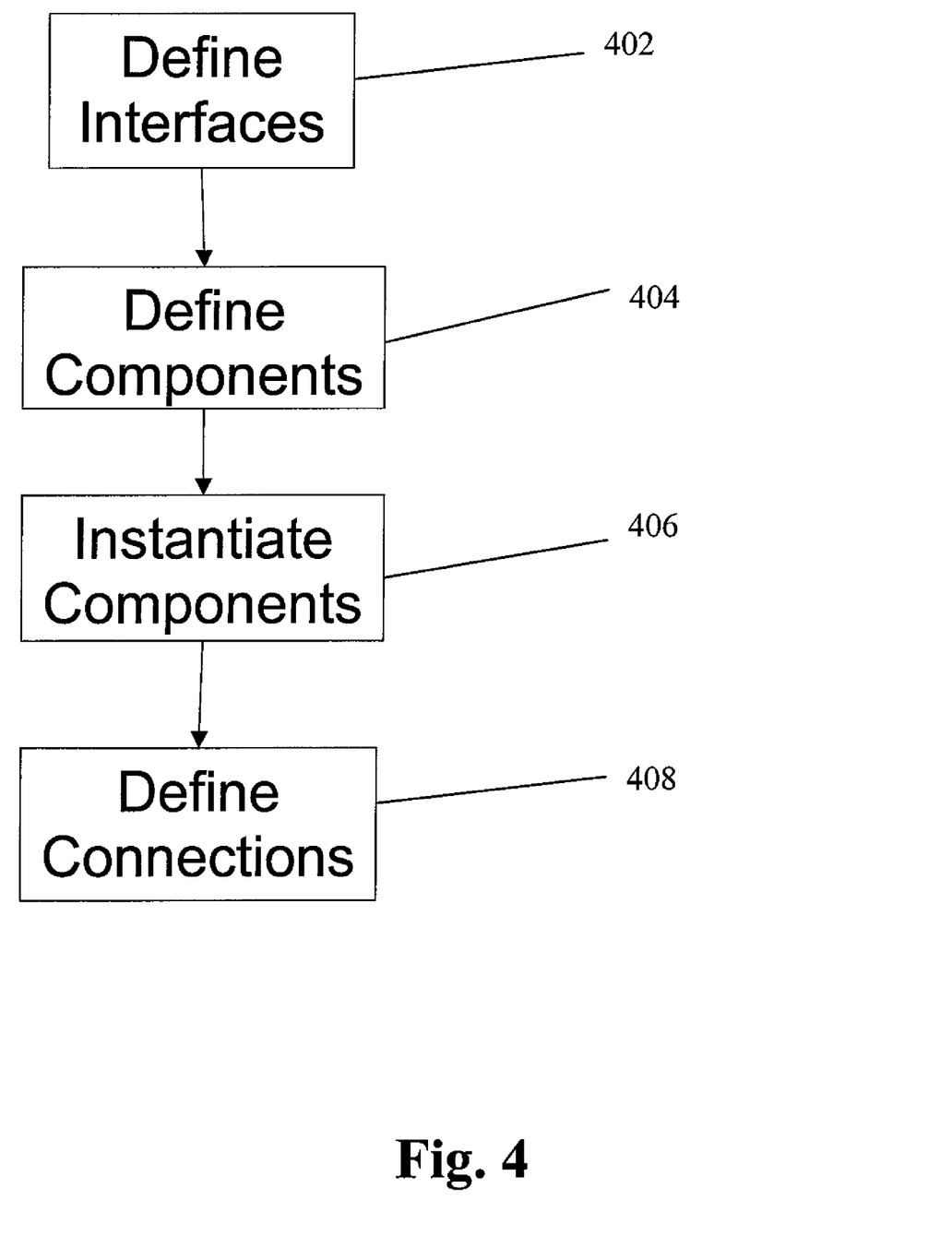
FIG. 4 shows a flowchart of a process for implementing a design entry interface according to some embodiments of the invention.

FIG. 4 shows a flowchart of a process for implementing an embodiment of the invention. At 402, interface types are defined for the electronic design. This action is performed based on the functionality of the interface, e.g. PCI or USB. The defined interface includes, for example, members which are the buses and pins that describe the functionality.

In some embodiments, this action is performed based upon implementation of the interface data structures as associated arrays, where indexing is based upon the name of the interface. Hash functions are used to search upon and find specific interfaces from among the number of defined interfaces. One advantage of this approach is that access to the interfaces become much faster, since there is no need to perform sequential searches for the interfaces.

Figure 5:
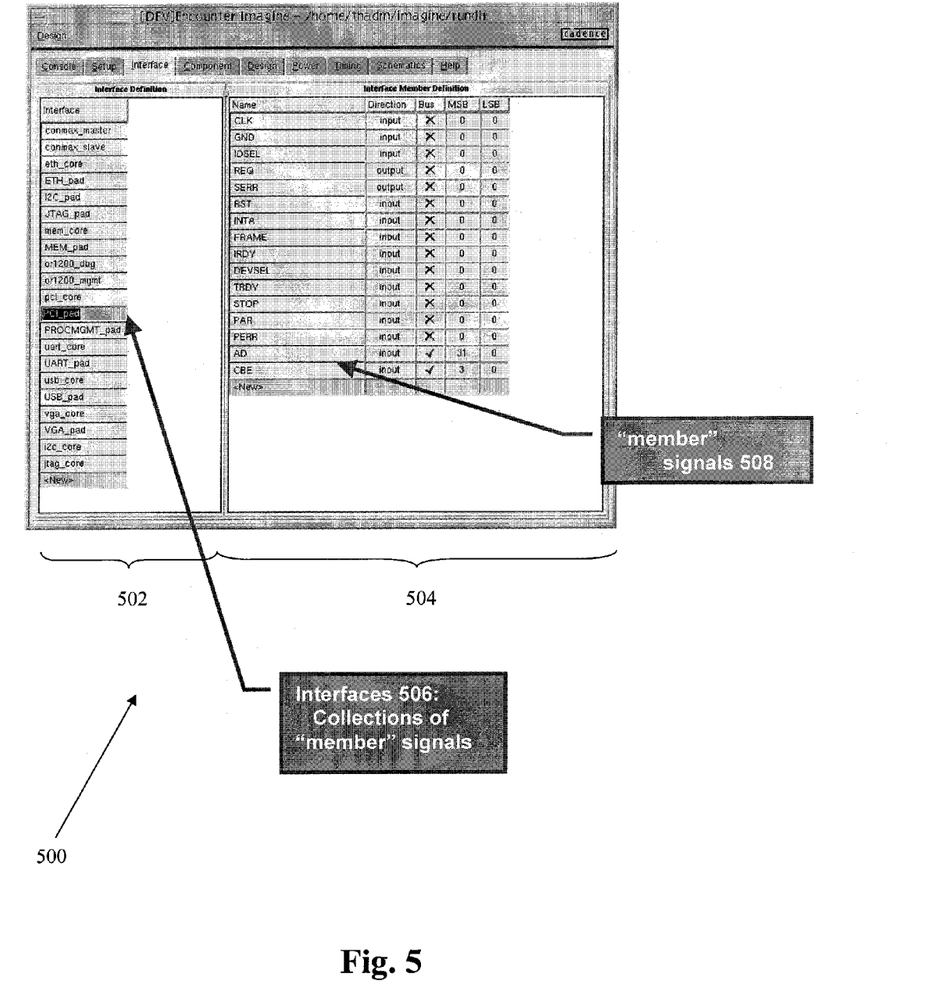
FIG. 5 illustrates an approach for defining interface types according to some embodiments of the invention.

FIG. 5 illustrates an interface approach for performing this action. The left portion 502 of the interface 500 shows the defined interface type 506, which are shown as a collection of member signals. The right hand portion 504 of the interface 500 illustrates member signals 508 for the interface 500. The example data elements shown in the right hand side 504 include information for signals, such as the direction, and indication whether it is a bus or just a single signal, most significant bits, and/or least significant bits if the member is a bus.

Returning back to FIG. 4, at 404, components are defined for the electronic design. This action is performed to define the components of the design by instantiating abstract interface types as the ports of the component. It also defines the physical attributes of the component, such as gate count, area or whether it contains other IPs.

As with interfaces, the underlying data structures for components in some embodiments may be implemented as associated arrays, where indexing is based upon the name of the component. Hash functions can also be used to search upon and find specific components from among the number of defined components in the overall design.

Figure 6:
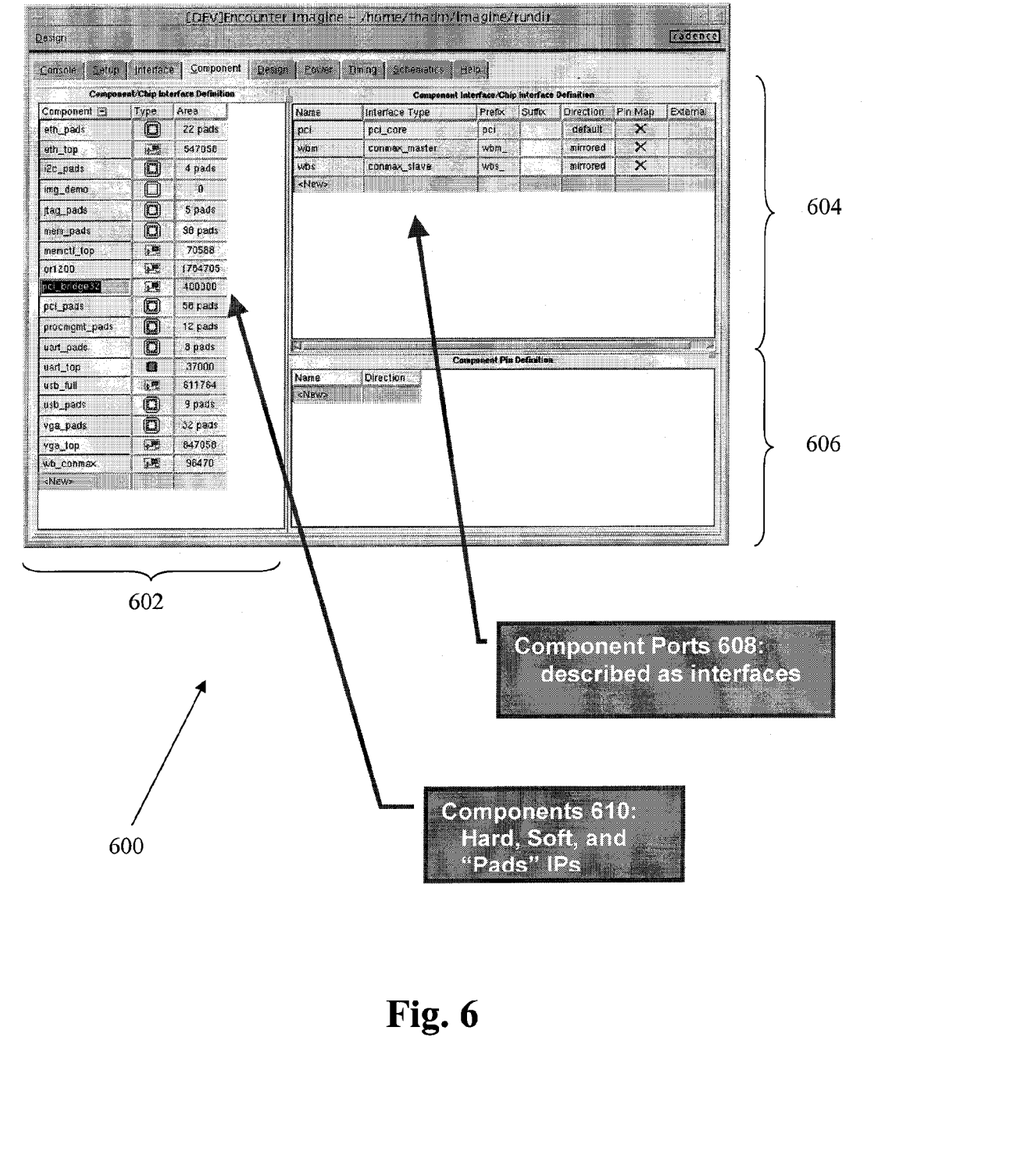
FIG. 6 illustrates an approach for defining components according to some embodiments of the invention.

FIG. 6 illustrates an interface approach for performing this action. The left portion 602 of the interface 600 shows the defined components 610. The upper right hand side 604 is used to define the interface definition 608 for the components. The lower right hand side 606 is used to define the component pin definitions.

It is noted that the above interfaces can be configured to place a limitation upon the type of entry that is permitted for one or more of the data elements of the definition. For example, the "Direction" column in the interface definition portion of FIG. 6 can be configured to only allow entry of defined types, such as "default" or "mirrored" types in that column.

Figure 7:
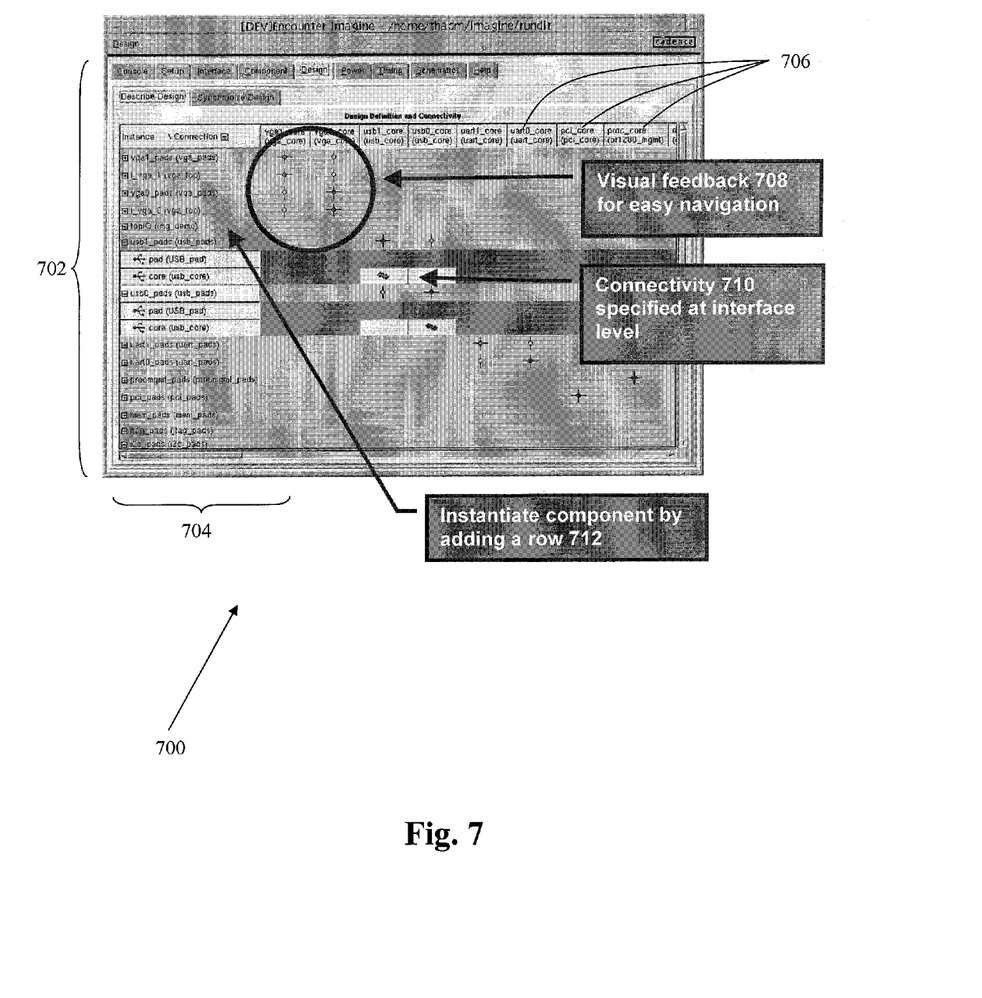
FIG. 7 illustrates an approach for defining component instances according to some embodiments of the invention.

Returning back to FIG. 4, at 406, components are instantiated for the electronic design. At 408, connections are also defined for the design. As illustrated in FIG. 7, each row 702 in the design connection graphical user interface 700 is a component of the design. The identifications of the instantiated components 712 are listed along the left side 704 of the interface 700. Each column 706 is a connection between component ports. In this example approach, the connection 710 is an interface based with the symbols described as above with respect to FIGS. 1 and 2.

The embodiments of the invention described herein address many of the shortcomings of current design-entry methods. For example, it allows the user to quickly and efficiently find compatible connection-points in a large design-space by providing the user with visual guidance 708 (cues) to those points, and the ability to sort the spreadsheet based on connection compatibility 710. This search and find effort is completely manual in existing design-entry methods. In addition, some embodiments disallow the user from connecting functionally incompatible instance-interfaces by disallowing such a connection, based on interface-type definitions. This is left to the user's memory in current design-entry methods.

Some disclosed embodiments allow the user to dynamically re-organize, or even filter, the portion of the design space that is being visualized and edited, based on immediate needs of the user, and with near-zero user-effort. Currently existing methods do not allow for this capability in any way. Complex design connectivity are presented such that it is much easier to visualize than a complex, multi-sheet schematic, and that still holds meaningful information even when low-level design detail (like the interfaces on a particular instance) is collapsed, minimized, or hidden.

Furthermore, some embodiments advantageously provide representation of collapsed (e.g., aggregate) connection status for each instance, without having to look at the details of a particular interface on the instance. This is represented in two ways. The first of these uses an aggregate icon to indicate connection compatibility for a particular instance, e.g., relative to a particular interface-type, in addition to actual connection status of the instance. The second is representation of an instance's status of being fully connected (e.g., in the color green) or not fully connected (e.g., in the color red).

Another advantage is that dynamic configuration of the body-cells in the spreadsheet to be configured to be either clickable or not-clickable, based on the compatibility of the associated instance-interface with a particular connection. This is a novel way of preventing the user from specifying incorrect connectivity, and of efficiently guiding the user to pertinent portions of the design space.

In addition, embodiments provide the ability to add or remove an instance-interface from a connection by simply clicking on the cell at the intersection of the interface-row and connection-column in the spreadsheet. Dynamic sorting/filtering of the design can be performed, e.g., using a spreadsheet based on connection/interface type, and connection compatibility.

System Architecture Overview

Figure 8:
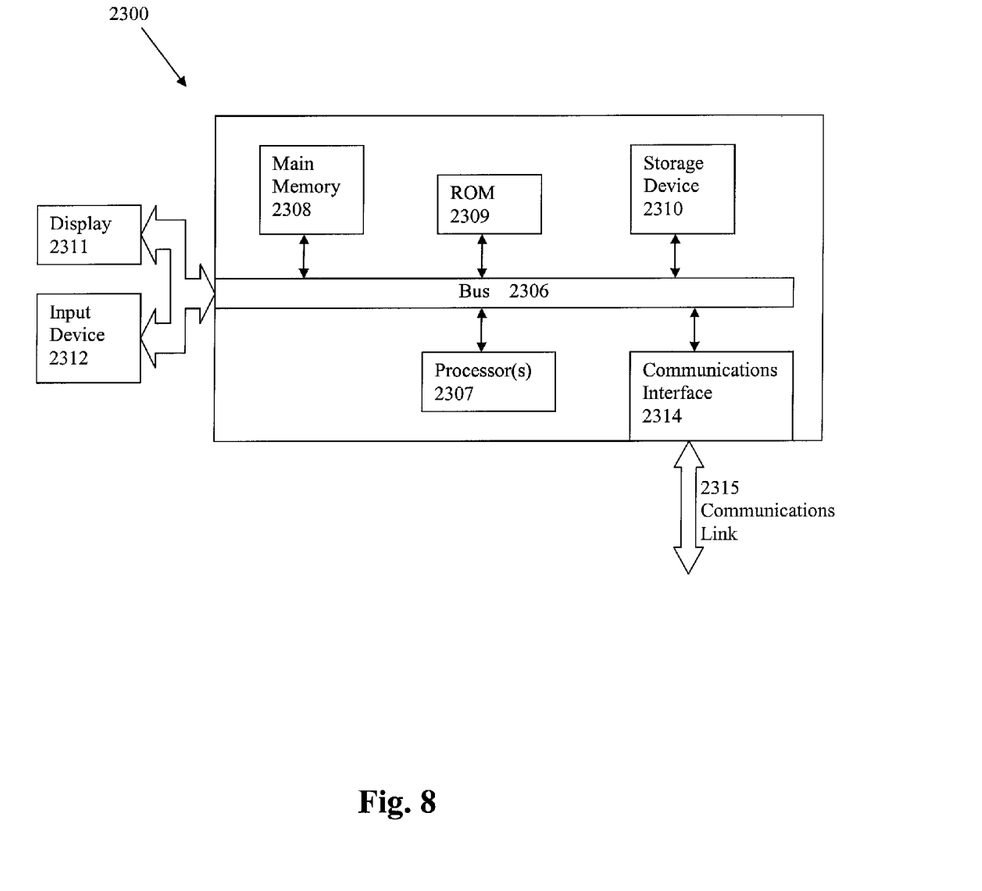
FIG. 8 shows an architecture of an example computing system with which the invention may be implemented.

FIG. 8 is a block diagram of an illustrative computing system 2300 suitable for implementing an embodiment of the present invention. Computer system 2300 includes a bus 2306 or other communication mechanism for communicating information, which interconnects subsystems and devices, such as processor 2307, system memory 2308 (e.g., RAM), static storage device 2309 (e.g., ROM), disk drive 2310 (e.g., magnetic or optical), communication interface 2314 (e.g., modem or Ethernet card), display 2311 (e.g., CRT or LCD), input device 2312 (e.g., keyboard), and cursor control.

According to one embodiment of the invention, computer system 2300 performs specific operations by processor 2307 executing one or more sequences of one or more instructions contained in system memory 2308. Such instructions may be read into system memory 2308 from another computer readable/usable medium, such as static storage device 2309 or disk drive 2310. In alternative embodiments, hard-wired circuitry may be used in place of or in combination with software instructions to implement the invention. Thus, embodiments of the invention are not limited to any specific combination of hardware circuitry and/or software. In one embodiment, the term "logic" shall mean any combination of software or hardware that is used to implement all or part of the invention.

The term "computer readable medium" or "computer usable medium" as used herein refers to any medium that participates in providing instructions to processor 2307 for execution. Such a medium may take many forms, including but not limited to, non-volatile media and volatile media. Non-volatile media include, for example, optical or magnetic disks, such as disk drive 2310. Volatile media include dynamic memory, such as system memory 2308.

Common forms of computer readable media include, for example, floppy disk, flexible disk, hard disk, magnetic tape, any other magnetic medium, CD-ROM, any other optical medium, punch cards, paper tape, any other physical medium with patterns of holes, RAM, PROM, EPROM, FLASH-EPROM, any other memory chip or cartridge, or any other medium from which a computer can read.

In an embodiment of the invention, execution of the sequences of instructions to practice the invention is performed by a single computer system 2300. According to other embodiments of the invention, two or more computer systems 2300 coupled by communication link 2315 (e.g., LAN, PTSN, or wireless network) may perform the sequence of instructions required to practice the invention in coordination with one another.

Computer system 2300 may transmit and receive messages, data, and instructions, including program, i.e., application code, through communication link 2315 and communication interface 2314. Received program code may be executed by processor 2307 as it is received, and/or stored in disk drive 2310, or other non-volatile storage for later execution.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. The specification and drawings are, accordingly, to be regarded in an illustrative rather than restrictive sense.

The invention claimed is:

1. A system for implementing a design entry interface of an electronic design, comprising:
   a non-transitory computer readable medium for storing an electronic design, wherein the electronic design comprises data corresponding to the design of an electronic device;
   a processor for executing program code;
   a program in execution using the processor, the program controlling the system to generate an interface having a spreadsheet structure, the spreadsheet structure comprising columns and rows and providing a representation of component instances and connection status for the component instances within the electronic design, the interface allowing entry of a connection or a disconnection within the electronic design based at least in part upon manipulation of a cell within the columns and the rows of the spreadsheet structure of the interface, in which the cell comprises an iconic cue to graphically indicate an instance that is compatible with the connection; and
   a display for displaying at least in part the spreadsheet structure, wherein the interface in spreadsheet format further provides an indication of allowable connections for the component instances within the electronic design.

2. The system of claim 1 in which one of the component instances is grouped with one or more member signals.

3. The system of claim 1 in which a visual icon is displayed to provide the connection status of the component instances.

4. The system of claim 3 in which the visual icon is used to identify the allowable connections for the component instances within the electronic design.

5. The system of claim 3 in which the visual icon is color coded to indicate connection status.

6. The system of claim 3 in which the visual icon is expandable or collapsible to change the quantity of information displayed regarding a connection.

7. The system of claim 5 in which the visual icon is collapsed to aggregate connection information or expanded to identify corresponding interfaces.

8. The system of claim 1 in which the representation of the component instances is color coded to identify connectivity for the component instances.

9. The system of claim 1 in which entries within the spreadsheet structure are sorted to support dynamic isolation of portions of design spaces within the electronic design.

10. The system of claim 9 in which the entries are sorted to organize component instances based upon connection compatibility, instance type, connection type, connection name, or instance name.

11. The system of claim 1 in which a limitation is placed upon an entry for a component instance.

12. The system of claim 1 in which filtering is performed upon a design space within the electronic design using the interface.

13. A method for implementing a design entry interface for generating an electronic design, comprising:
   defining interface types for an electronic design, wherein the interface types correspond to one or more interfaces that are used within the electronic design to functionally connect a first component with a second component within the electronic design;
   defining components for the electronic design;
   instantiating, by using a processor, one or more instances of the components within the electronic design;
   identifying connections between the components within the electronic design; and
   displaying, on a display device, a spreadsheet structure of an interface, the spreadsheet structure comprising columns and rows and providing a representation of component instances and connection status for the component instances within the electronic design, the interface allowing entry of a connection or a disconnection within the electronic design based at least in part upon manipulation of a cell within the columns and rows of the spreadsheet structure of the interface, in which the cell comprises an iconic cue to graphically indicate an instance that is compatible with the connection.

14. The method of claim 13 in which the interface provides an indication of allowable connections for the component instances within the electronic design.

15. The method of claim 13 in which data structures for the interface types or components are implemented as associated arrays.

16. The method of claim 13 in which the interface types are implemented as a collection of member signals.

17. The method of claim 13 in which components are defined relative to an interface definition and pin definition.

18. The method of claim 13 in which instantiation of a component corresponds to entry of a row in the spreadsheet structure.

19. The method of claim 13 in which a visual icon is displayed to provide the connection status of the component instances.

20. The method of claim 19 in which the visual icon is used to identify the allowable connections for the component instances within the electronic design.

21. The method of claim 13 in which entries within the spreadsheet structure are sorted to support dynamic isolation of portions of design spaces within the electronic design.

22. The method of claim 21 in which the entries are sorted to organize component instances based upon connection compatibility, instance type, connection type, connection name, or instance name.

23. The method of claim 13 in which a limitation is placed upon the type of entry permitted for a component instance.

24. A computer program product comprising a non-transitory computer readable medium having instructions which, when executed by a processor, causes the processor to execute a process for implementing a design entry interface for generating an electronic design, the process comprising:
- defining interface types for an electronic design, wherein the interface types correspond to one or more interfaces that are used within the electronic design to functionally connect a first component with a second component within the electronic design;
- defining components for the electronic design;
- instantiating one or more instances of the components within the electronic design;
- identifying connections between the components within the electronic design; and
- displaying a spreadsheet structure of the design entry interface, the spreadsheet structure comprising columns and rows and providing a representation of component instances and connection status for the component instances within the electronic design, the interface allowing entry of a connection or a disconnection within the electronic design based at least in part upon manipulation of a cell within the columns and rows of the spreadsheet structure, in which the cell comprises an iconic cue to graphically indicate an instance that is compatible with the connection.

25. The product of claim 24 in which one of the component instances is grouped with one or more member signals.

26. The product of claim 24 in which a visual icon is displayed to provide the connection status of the component instances.

* * * * *